US005563470A

United States Patent [19]
Li

[11] Patent Number: 5,563,470
[45] Date of Patent: Oct. 8, 1996

[54] TILED PANEL DISPLAY ASSEMBLY

[75] Inventor: Che-Yu Li, Ithaca, N.Y.

[73] Assignee: Cornell Research Foundation, Inc., Ithaca, N.Y.

[21] Appl. No.: 297,958

[22] Filed: Aug. 31, 1994

[51] Int. Cl.⁶ ...................................................... H01J 1/62
[52] U.S. Cl. ............................ 313/496; 313/485; 445/24
[58] Field of Search ................................. 313/485, 495, 313/496; 445/44, 24

[56] References Cited

U.S. PATENT DOCUMENTS

| | | | |
|---|---|---|---|
| 4,039,890 | 8/1977 | Bailey et al. | 313/500 |
| 4,283,118 | 8/1981 | Inoue | 359/88 |
| 4,369,975 | 1/1983 | Tarc | 273/237 |
| 4,439,813 | 3/1984 | Dougherty et al. | 361/321.3 |
| 4,703,559 | 11/1987 | Ehrfeld | 29/854 |
| 4,733,127 | 3/1988 | Takasu | 313/500 |
| 4,833,542 | 5/1989 | Hara | 348/383 |
| 4,853,296 | 8/1989 | Fukuyoshi | 428/623 |
| 4,862,153 | 8/1989 | Nakatani et al. | 345/80 |
| 4,864,470 | 9/1989 | Nishio | 361/760 |
| 4,932,883 | 6/1990 | Hsia | 439/66 |
| 4,980,774 | 12/1990 | Brody | 348/383 |
| 5,061,663 | 10/1991 | Bolt | 501/95 |
| 5,067,021 | 11/1991 | Brody | 348/383 |
| 5,068,740 | 11/1991 | Brody | 348/383 |
| 5,079,636 | 1/1992 | Brody | 348/383 |
| 5,164,263 | 11/1992 | Bolt | 428/402 |
| 5,194,934 | 3/1993 | Yamazaki et al. | 257/782 |

OTHER PUBLICATIONS

Heat Conduction In Metal–Filled Polymers: The Role Of Particle Size, Shape & Orientation; Hansen et al., Polymer Engineering & Science; May 1975; vol. 15, No. 5; pp. 353–356.

Aluminum Nitride Fibers From A Thermoplastic Organoaluminum Precursor; Bolt et al; Materials Research Society; 1988; vol. 108; pp. 337–344.

Primary Examiner—Kevin A. Kriess
Assistant Examiner—Lawrence O. Richardson
Attorney, Agent, or Firm—Jones, Tullar & Cooper, P.C.

[57] ABSTRACT

A panel display includes a common substrate on which a plurality of small display tiles are mounted in an array and electrically interconnected to replicate a large area panel. Each tile includes a plurality of contact pads which are aligned with corresponding contact pads on the substrate. Solder joints between corresponding contact pads mechanically align and secure the tiles on the substrate, and provide electrical connections therebetween. Selected substrate contact pads are electrically interconnected to provide electrical connections between adjacent tiles.

30 Claims, 1 Drawing Sheet

TILED PANEL DISPLAY ASSEMBLY

BACKGROUND OF THE INVENTION

The present invention relates, in general, to a method for making large area panel displays from a plurality of smaller panel display tiles, and more particularly to a technique for aligning and assembling such small display tiles into a large area display and selectively electrically interconnecting the tiles.

A common problem in the manufacture of large area panel displays is that of a relatively low yield. If, for example, a small area display has a yield of 90%, a display having an area 15 times larger will have a yield of $0.9^{15}$, or about 20%, for the same type of display and using the same manufacturing techniques. Thus, the larger the display, the lower the yield, using conventional technology.

SUMMARY OF THE INVENTION

In accordance with the present invention, the manufacturing yield for large area panel displays is significantly improved by the utilization of a large number of small area displays mounted on a common substrate and electrically interconnected to replicate the function of a large area display. In accordance with the invention, area array solder joints are used to align and to assemble a multiplicity of small area display elements, or tiles, into a corresponding large display, with the solder joints also serving to provide electrical interconnections.

Traditionally, area array solder joints have been used to electrically connect a semiconductor chip to a substrate in a "flip-chip" configuration. When such solder joints are in the liquid form during reflow, the surface tension of the solder will serve to align the chip to the substrate, and this effect has been used in the prior art for mounting two optical or optoelectronic components in side-by-side relationship when high precision alignment is required. In accordance with the present invention such a passive alignment technique is used for mechanically and electrically coupling an display tile to a base plate which may incorporate circuitry for provide electrical interconnects between the tiles.

The alignment of tiles is accomplished by precisely and accurately positioning locator pads on the base plate to which the tiles are to be mounted, and positioning corresponding locator pads on the surface of the tile which will be adjacent the base plate. Conventional lithographic techniques permit the location of such pads with an accuracy of less than a few microns, thus enabling the horizontal position of a tile to be precisely located on the base plate, or substrate. The locator pads are of a material which will accept a flowable joint material which can be deposited on one set of pads. The tiles are then positioned over the base plate with the joint material aligned with the locator pads on the base plate, and the joint material is caused to flow to contact the corresponding pads so that the tiles are joined to the base plate. The flowable joint material preferably is solder, and the contact pads preferably are a metal which will be wetted by the solder for mechanically and electrically coupling the corresponding pads to each other to mechanically mount the tiles on the base plate and to provide electrical connections therebetween. Selected pads and the connecting solder joints may be used to provide electrical connections between components within a tile or in adjacent tiles, while other pads may provide only mechanical support. The pads will be referred to hereinafter as metal pads, but it will be understood that other materials wettable by the joint material and electrically conductive where required may also be used.

The vertical position of a tile; i.e., the spacing between the surface of the base plate and the opposed surface of the adjacent tile, will depend on the volume of the solder joint and on the size and shape of the opposed metal pads on the tile and on the substrate. Once the pad shapes and sizes are determined, the volume of the solder must be carefully controlled in order to achieve a reproducible and uniform vertical position. As noted, the solder joints not only provide mechanical connections between the tile and the base plate, but some of them also provide electrical connections.

A common structure for pads that receive solder joints consists of three layers of metal in the sequence Cr/Cu/Au, with the Cr layer attached to the base plate. Other structures may also be used, as desired. The composition of the solder is often that of a Pb/Sn alloy with the Sn content varying, depending on the reflow temperature desired. A controlled volume of solder can be applied to the pads by screen printing using a paste, or evaporation, or plating through a mask. Alternatively, solder balls of controlled size can be positioned individually on each metal pad for subsequent reflow. A sufficiently large array of solder joints; e.g., an array greater than 20×20, has been shown to achieve a uniform equilibrium solder joint height to within less than a few microns. When paste, evaporation, or plating through a mask is used to apply the solder, the height of the solder joint will depend on the distribution and the size of openings in the mask through which the solder is applied, and upon the amount of solder deposited.

BRIEF DESCRIPTION OF THE DRAWINGS

The foregoing, and additional objects, features, and advantages of the present invention will become apparent to those of skill in the art from the following detailed consideration of preferred embodiments thereof, taken in conjunction with the accompanying drawings, in which.

DESCRIPTION OF PREFERRED EMBODIMENTS

Figure 1:
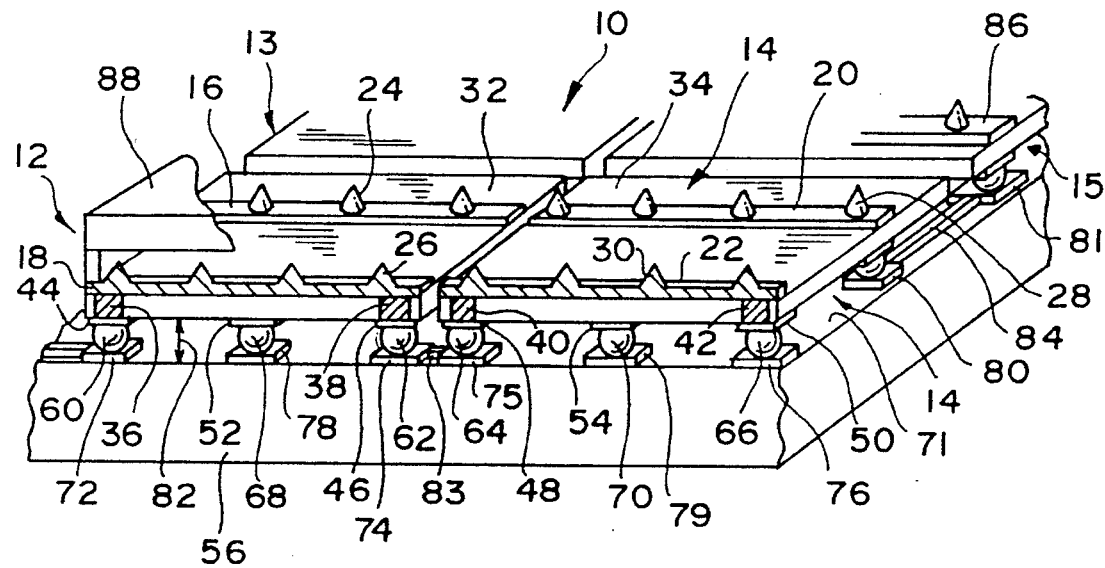
FIG. 1 is a schematic, perspective cross-sectional view of four tiles for a field emission type flat panel display.

Turning now to a more detailed description of the invention, there is illustrated in FIG. 1 in schematic form a panel display 10 incorporating four display tiles 12, 13, 14, and 15. The display tiles may take many forms, and thus may incorporate, for example, active matrix thin film transistors or field emitters. The first illustrated embodiment incorporates a plurality of field emitters on each tile to form a panel display. Thus, for example, each tile includes a pair of cathode strips, such as cathodes 16 and 18 on tile 12 and cathodes 20 and 22 on tile 14, each of the cathodes containing a row of micro-tips, such as the tips 24, 26, 28, and 30, respectively. Although the micro-tips are shown in relatively large scale, it should be understood that each illustrated tip represents a cluster of tips forming a pixel, so that, for example, the cathode strip 16 includes a multiplicity of micro-tip clusters, each cluster representing a pixel for a field emission display.

The cathode strips and their respective micro-tips are fabricated, for example, from refractory metals, and are deposited on electrically insulating substrates, such as substrates 32 or 34, to produce the generally rectangular tiles 12 and 14, respectively. The substrates are fabricated from an electrically insulating material such as glass, or polymer, and may be transparent or optically opaque in the illustrated embodiment, where the micro-tips provide the required field emission. In cases where light is to be transmitted through the substrate, it is transparent. Each of the substrates contains a plurality of vias such as those illustrated at 36 and 38 in substrate 32 and at 40 and 42 in substrate 34. These vias are filled with metal during the fabrication process and connect respective cathode strips, such as strips 18 and 22, to corresponding metal locator pads, such as contact pads 44, 46 and pads 48, 50 on the under surfaces of the tiles 12 and 14. These contact pads may be separate elements deposited on the tile, or may be a part of the metal which fills a corresponding via if desired, and are located on the bottom surfaces of substrates 32 and 34. Additional contact pads such as the pads 52 and 54 may also be located on the undersurface of substrates 32 and 34 to form an array of contact pads either for electrical connection to other components carried by the substrates or for mechanical connection of the substrate to a base plate such as the plate 56, or for both, as will be described.

Each of the upper contact pads 44, 46, 48, 50, 52, and 54 on substrates 32 and 34 are connected mechanically or electrically, or both, through solder joints 60, 62, 64, 66, 68 and 70 to a corresponding array of opposed metal locator, or contact, pads on a top surface 71 of the underlying base plate 56. Thus, for example, surface 71 carries corresponding lower contact pads 72, 74, 75, 76, 78, 79, 80 and 81. The metallization required to form the upper and lower contact pads is provided through conventional photolithographic techniques to accurately position the contact pads within very close tolerances so that the tiles 12, 13, 14 and 15 will be properly positioned when the solder balls are heated and caused to reflow to form solder joints.

The geometry and dimensions of the solder joints and the contact pads are controlled to insure uniformity and reproducibility of the spacing, or gap, indicated by arrow 82 between the top surface 71 of the base plate and the bottom surfaces of the tiles. The solder joints also provide electrical interconnection between the upper contact pads on the substrates 12–15 and the corresponding lower contact pads on the top surface of base plate 56.

In addition to the contact pads described above, the base plate includes metallization to interconnect selected contacts so that the solder joints not only provide mechanical and electrical interconnection between the substrates 12 and 14 and the base plate 56, but also provide electrical interconnections between adjacent tiles. For example an interconnect metal strip 83 is provided between, base contact pads 74 and 75 to electrically connect these pads. Solder joints 62 and 64 provide an interconnection between cathode strip 18 and cathode strip 22 through vias 38 and 40 and interconnect 83. In addition to the end-to-end connection illustrated by contact pads 74 and 75 and interconnect 83, additional metallization can be provided on surface 71, as illustrated by interconnect 84 between contact pads 80 and 81, which electrically connects strip 20 on tile 14 to a parallel strip 86 on adjacent tile 15. It is noted that since the cathode strips 20 and 22 on tile 14 are about 10 mils or more apart, the same spacing between the adjacent, parallel strips 20 and 86 on adjacent tiles 14 and 15 is easily achieved.

It will be understood that any number of such tiles may be positioned in side-by-side relationship on the top surface of the base plate 56 so that a multiplicity of small array tiles may be mechanically secured on the base and electrically interconnected to produce a large field emission array.

A display face plate 88 having a suitable phosphorous coating and responsive to the emissions from the micro-tips is mounted to form a top surface for the tiles 12, 13, 14, 15, etc., and is spaced a suitable distance from the micro-tips. The face plate 88 may be the same size as each corresponding substrate, such as substrate 32, with the face plates being sealed and evacuated to form plural enclosed small display tiles. Alternatively, a single face plate covering plural tiles may be used.

Each completed display tile can be tested before assembly to the base plate 56 so that the relatively low yield of large arrays is obviated, and a high yield is obtained. Even after assembly, a defective tile can be easily removed by reflowing the solder joints.

In fabricating the display assembly, the upper contact pads on the bottom surfaces of the tiles and the lower contact pads on the top surface 71 of the base plate 56 are precisely and accurately located, as by conventional photolithographic techniques, and after metallization to form the pads and interconnects, the solder is applied to the upper contact pads (such as pad 44) or to the lower contact pads (such as pad 72) or to both, as by screen printing using a paste, or by evaporation, or by plating through a mask. Alternatively, solder (such as ball 60) balls of controlled size can be mechanically positioned on each of the upper or lower contact pads. The tiles are then positioned on the base plate in or near the desired alignment. The assembly is then heated to cause the solder to flow, with the surface tension of the solder located on the contact pads effectively aligning the tiles on the underlying base plate 56. Since the locations of the pads are defined to within a few microns, the tiles can be precisely located in the horizontal plane. The vertical position of the tile depends upon the volume of the solder in each joint as well as on the sizes and shapes of the connecting metal pads. These sizes and shapes are defined lithographically so that the tiles can be precisely and reproducibly positioned vertically to provide proper spacing between adjacent tiles and to mount the display faces of the tiles in a common plane.

The interconnects, such as those shown at 83 and 84, are constructed so that the deposited solder or solder balls will not flow onto them when the solder is heated to join the tiles to the base plate. This insures that adjacent solder balls, such as those shown at 62 and 64 for example, will not contact the interconnect 83 when the solder is reflowed, thus retaining the solder in place to insure proper electrical and mechanical connection between upper contact pads 46 and 48 and their corresponding lower contact pads 74 and 75.

It should be understood that the shape of the individual solder joints formed from deposited solder or solder balls illustrated in FIG. 1, is not critical. If desired, the solder joints can be elongated, circular, or in rows or in any other shape; for example a joint can extend along the entire length of a cathode strip, if desired, as long as the soldered area is sufficient to produce the desired passive alignment due to surface tension effects. Again, the solder joints should be of adequate size and number to insure the uniformity and reproducibility of the equilibrium height of the solder joints and positioned to provide the desired electrical interconnections.

Figure 2:
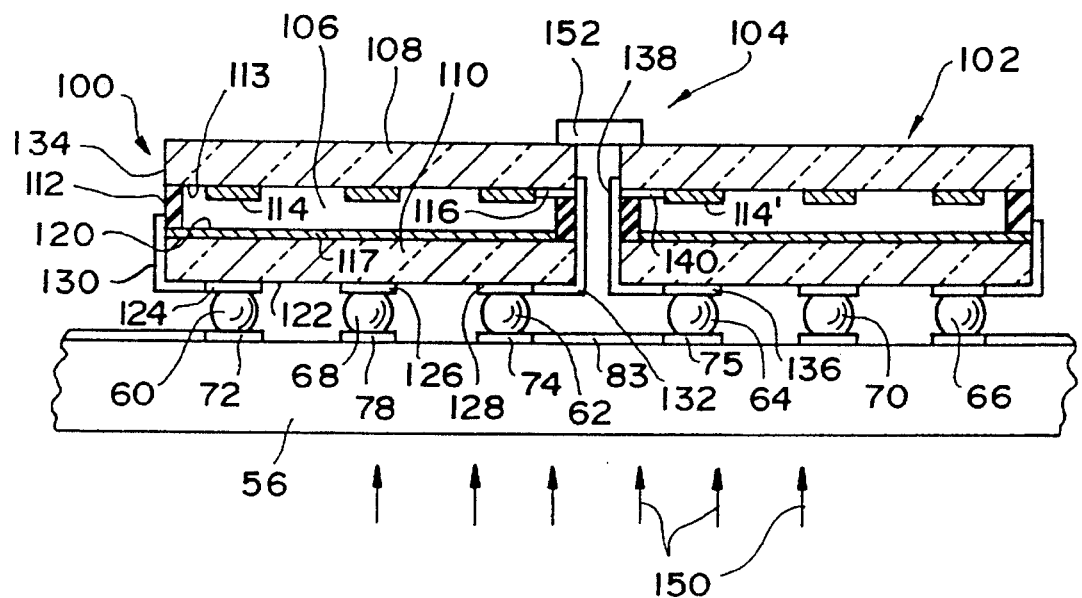
FIG. 2 is a diagrammatic cross-sectional view of two tiles in a thin film transistor active matrix type flat panel display.

A second embodiment of the invention is illustrated in FIG. 2, which depicts schematically a cross-section through two tiles 100 and 102 which are part of a large, tiled thin film transistor active matrix type panel display generally indicated at 104. Each tile, such as the tile 100, consists of a liquid crystal polymer 106 sandwiched between a front (or top) glass plate 108 and a rear (or bottom) glass plate 110, with the periphery of the tile being sealed, for example, by epoxy 112. Attached to the under surface 113 of the top glass plate 108 are a plurality of transparent top electrodes 114 which are located photolithographically, for example, and which are activated by thin film transistors (not shown) in the conventional manner. The electrodes 114 are interconnected, as may be required, by suitable metallization on the under surface of plate 108, such metallization being illustrated by conductive line 116, for example, leading from an electrode to the edge of the tile for connection to a suitable interconnect, to be described.

The upper, or inner, surface 117 of the bottom plate 110 is coated by a thin, transparent electrode 120, while the under surface 122 of the bottom glass plate 110 may carry a plurality of upper metal locator, or contact, pads such as those illustrated at 124, 126, and 128. These contact pads are similar to pads 44, 46, and 52 illustrated in FIG. 1 and discussed above, and thus are carefully and precisely located on the undersurface of the tile 100 to electrically connect and mechanically secure the tile to a suitable base plate, such as the electrically insulating base plate 56, also described with respect to FIG. 1. The base plate may carry lower metal locator, or contact pads 72, 74 and 78, also as described with respect to FIG. 1, positioned to receive the tile 100 and to locate it with respect to adjacent tiles. Solder joints 60, 62, and 68 are provided between the upper contact pads on tile 100 and the corresponding lower contact pads on base plate 56 in the manner previously described to provide reproducible and uniform equilibrium heights of the joints as well as to provide mechanical and electrical interconnections.

Electrical interconnects may also be provided on the sides of the tiles and on the bottom surface 122 of the glass plate 110, as illustrated by interconnects 130 and 132 on tile 100. Interconnect 130 extends along the outer peripheral surface 134 and along the bottom surface 122 of tile 100 to interconnect the electrode 120 with contact pad 124 and through that pad and solder joint 60 to the contact 72 on base plate 56. In similar manner, interconnect line 132 extends along the outer peripheral surface 134 of tile 100 and along the bottom surface 122 to contact pad 128 for connection through solder joint 62 to contact pad 74. This interconnect line 132 is electrically connected to metal line 116 to connect selected transparent internal electrode 114 to the exterior contact pad 74. As illustrated in FIG. 2, contact pad 74 is connected through the metallized interconnect 83 on the surface of base plate 56 to the adjacent contact pad 75 located beneath the next adjacent tile 102 for electrical connection to that tile through solder joint 64. As illustrated, the solder joint 64 contacts a corresponding contact pad 136 on the bottom of tile 102 and, by way of interconnect line 138 and metallized line 140, the contact pad 136 is connected to a transparent electrode 114' which corresponds to the electrode 114 in tile 100. In this way, adjacent tiles are electrically interconnected so that multiple tiles can be used to produce a large panel display. As noted with respect to FIG. 1, the spacing between adjacent electrodes 114 on the same tile is typically about 10 mils or greater. The interconnection between adjacent tiles permits the same horizontal spacing between electrodes in adjacent tiles to be easily achieved.

Panel displays of the type illustrated in FIG. 2 are back lit, as illustrated by arrows 150. A suitable mask 152 is provided between adjacent tiles to prevent backlight from passing between tiles.

Thus, there has been disclosed a panel display tile assembly wherein solder joints are used in conjunction with connector pad arrays for aligning, assembling, and electrically interconnecting tiles with each other and with a common base plate, or substrate, to produce a single display unit incorporating a multiplicity of tiles. Although the present invention has been described in terms of preferred embodiments, it will be apparent to those of skill in the art that numerous variations and modifications may be made without departing from the true spirit and scope thereof as set forth in the following claims.

What is claimed is:

1. A panel display, comprising:

a base having a relatively large top surface area;

a plurality of display tiles, each display tile having a top surface and a bottom surface, the top surface of each tile being relatively small with respect to said base top surface area, said plurality of tiles having a total top surface area substantially equal to said base top surface area;

a second array of locator contacts on the bottom surface of each display tile, said contacts being precisely positioned for accurately locating each display tile on said base;

a first array of locator contacts on the top surface of said base, said first array of contacts being precisely positioned for receiving and accurately locating said display tile on said base; and connector joints for mechanically interconnecting said second array of tile locator contacts with corresponding locator contacts of said first array, said joints being selected to provide a predetermined, uniform vertical spacing between each said tile and said base and to mechanically secure said tiles on said base, with selected joints providing electrical connections between selected contacts on said display tiles and said substrate to thereby electrically interconnect said tiles.

2. The display of claim 1, wherein said connector joints comprise a reflowable material.

3. The display of claim 1, wherein said connector joints comprise solder.

4. The display of claim 1, wherein each display tile includes emitter means electrically connected to corresponding contacts of said second array.

5. The display of claim 4, wherein each said display tile further includes a via connecting said emitter means to selected contacts in said second array.

6. The display of claim 4, wherein each said display tile further includes connector leads on an outer surface thereof to connect said emitter means to selected contacts in said second array.

7. The display of claim 1, wherein each of said plurality of display tiles incorporates an individual display screen.

8. The display of claim 1, further including a single display screen covering said plurality of tiles.

9. The display of claim 1, wherein each display tile includes a thin film transistor active matrix display.

10. The display of claim 9, wherein said active matrix display includes electrodes, and electrical interconnects on said tiles electrically connecting selected electrodes to corresponding tile contacts.

11. The display of claim 10, wherein said electrical interconnects comprise connector leads on exterior surfaces of said tiles.

12. The display of claim 1, further including metallized electrical interconnects extending between selected locator contacts on the top surface of said substrate for electrically interconnecting adjacent display tiles.

13. The display of claim 1, wherein said locator contacts of said first and second arrays comprise metal contact pads.

14. The display of claim 13, wherein each said metal contact pad comprises plural metal layers.

15. The display of claim 1 wherein each said connector joint comprises reflowable solder secured to a corresponding locator contact, said solder being sized to provide uniform equilibrium solder joint heights when said solder is reflowed to join said tiles to said substrate.

16. The display of claim 15, wherein said first array of contacts on said substrate includes plural groups of substrate metal contact pads, one group for each of said display tiles.

17. The display of claim 16, wherein said second array of contacts on each tile includes a plurality of tile metal contact pads, each tile being positioned for alignment with a corresponding group of substrate metal contact pads.

18. The display of claim 17, wherein reflowable solder joints connect and align corresponding tile and substrate metal contact pads.

19. The display of claim 1, wherein said connector joint comprises a conductive adhesive material.

20. A high yield large area display panel comprising:
   a base having a top surface with a relatively large top surface area;
   a plurality of small area display tiles, each selected for its display characteristics and each having a top surface and a bottom surface, the top surface of each tile being smaller in area than said base top surface;
   an array of base locator contacts on said top surface of said base, said base locator contacts being positioned for receiving and accurately locating said display tiles on said base;
   an array of tile locator contacts on the bottom surface of each of said display tiles, said tile locator contacts being precisely positioned for alignment with corresponding base locator contacts for accurately locating each display tile on said base; and
   connector joints for interconnecting said base locator contacts with corresponding said tile locator contacts to bond said plurality of tiles on said base, said connector joints being reflowable to passively align said tile locator contacts with said base locator contacts during reflow.

21. The display panel of claim 20, wherein said reflowable connector points electrically and mechanically interconnect said tiles and base.

22. The display panel of claim 20, wherein a first selected group of the reflowable connector joints electrically interconnects said tiles and base and a second selected group of the reflowable connector joints provides mechanical support but not an electrical connection between said tiles and base.

23. The display panel of claim 20, wherein at least one display tile has a side surface and at least one tile side locator contact located on said side surface.

24. The display panel of claim 23, further including a second connector joint for interconnecting said tile side locator contact with a selected base locator contact.

25. The display panel of claim 20, wherein said display tiles are liquid crystal display elements.

26. The display panel of claim 20, wherein said display tiles are field emitters.

27. The display panel of claim 20, wherein said display tiles incorporate active matrix thin film transistors.

28. The display panel of claim 20, wherein said base is a transparent substrate.

29. The display panel of claim 20, wherein said base is an opaque substrate.

30. A high yield large area display panel comprising:
   a base having a top surface with a relatively large top surface area;
   a plurality of small area liquid crystal display tiles, each selected for its display characteristics and each having a top surface and a bottom surface, the top surface of each tile being smaller in area than said base top surface;
   an array of base locator contacts on said top surface of said base, said base locator contacts being positioned for receiving and accurately locating said display tiles on said base;
   an array of tile locator contacts on the bottom surface of each of said display tiles, said tile locator contacts being precisely positioned for alignment with corresponding base locator contacts for accurately locating each display tile on said base;
   connector joints for interconnecting said base locator contacts with corresponding tile locator contacts to bond said plurality of tiles on said base, said connector joints being reflowed to passively align said tile locator contacts with said base locator contacts during reflow.

* * * * *

UNITED STATES PATENT AND TRADEMARK OFFICE
CERTIFICATE OF CORRECTION

PATENT NO. : 5,563,470
DATED : October 8, 1996
INVENTOR(S) : Che-Yu LI

It is certified that error appears in the above-indentified patent and that said Letters Patent is hereby corrected as shown below:

Claim 21, column 7, line 46, "points" should read —joints—.

Signed and Sealed this

Twenty-fourth Day of December, 1996

Attest:

BRUCE LEHMAN

*Attesting Officer*    *Commissioner of Patents and Trademarks*